(12) United States Patent
Allen et al.

(10) Patent No.: US 9,909,460 B2
(45) Date of Patent: Mar. 6, 2018

(54) QUANTUM OTTO ENGINE

(71) Applicants: Lockheed Martin Corporation, Bethesda, MD (US); KOC University, Sariyer (TR)

(72) Inventors: Edward Henry Allen, Bethesda, MD (US); Ferdi Altintas, Istanbul (TR); Ali U. Cemal Hardal, Istanbul (TR); Özgür Müstecaplioglu, Istanbul (TR)

(73) Assignees: Lockheed Martin Corporation, Bethesda, MD (US); Koc University, Istanbul (TR)

( * ) Notice: Subject to any disclaimer, the term of this patent is extended or adjusted under 35 U.S.C. 154(b) by 55 days.

(21) Appl. No.: 15/008,263

(22) Filed: Jan. 27, 2016

(65) Prior Publication Data
US 2016/0221825 A1  Aug. 4, 2016

Related U.S. Application Data

(60) Provisional application No. 62/109,410, filed on Jan. 29, 2015.

(51) Int. Cl.
*F01K 13/00* (2006.01)
*G01R 33/035* (2006.01)
(Continued)

(52) U.S. Cl.
CPC .............. *F01K 13/00* (2013.01); *F01K 27/00* (2013.01); *G01R 33/035* (2013.01); *G01R 33/1284* (2013.01); *B82Y 99/00* (2013.01)

(58) Field of Classification Search
CPC ....... F01K 13/00; F01K 27/00; G01R 33/035; G01R 33/1284; B82Y 99/00
(Continued)

(56) References Cited

U.S. PATENT DOCUMENTS

2004/0140537 A1\* 7/2004 Il'ichev et al. ........ B82Y 10/00
257/661

FOREIGN PATENT DOCUMENTS

WO  WO 2014/028302  \* 7/2004
WO  WO 2014/020595  \* 2/2014

OTHER PUBLICATIONS

Quan et al, Maxwell's Demon Assisted Thermodynamic Cycle in Superconducting Quantum Circuits, 2006.\*
(Continued)

*Primary Examiner* — Hoang Nguyen
(74) *Attorney, Agent, or Firm* — Baker Botts L.L.P.

(57) ABSTRACT

Systems and methods for operating a quantum Otto cycle, including a superconducting LC resonator circuit electrically coupled to an input control unit with a reservoir source and a waveform generator configured to generate a bias current. A superconducting flux qubit is coupled to the LC resonator via a superconducting quantum interference device ("SQUID"). The SQUID generates a flux in the presence of the bias current, and the flux generated by the SQUID mediates a coupling rate between the flux qubit and the LC resonator. The waveform generator alternates the bias current to adiabatically change the coupling rate between the flux qubit and the LC resonator during adiabatic stages of the quantum Otto cycle. The reservoir source sends pulses to thermalize the flux qubit and the LC resonator system during isochoric stages of the quantum Otto cycle.

21 Claims, 5 Drawing Sheets

(51) Int. Cl.
   *F01K 27/00*    (2006.01)
   *G01R 33/12*    (2006.01)
   *B82Y 99/00*    (2011.01)
(58) Field of Classification Search
   USPC .................................................. 60/721, 911
   See application file for complete search history.

(56) References Cited

OTHER PUBLICATIONS

Fink et al, Quantum-To-Classical Transition in Cavity Quantum Electrodynamics, 2010.*
Grajcar et al, Sisyphus cooling and amplification by a superconducting qubit, 2008.*

* cited by examiner

QUANTUM OTTO ENGINE

RELATED APPLICATION

This application claims the benefit under 35 U.S.C. § 119(e) of the priority of U.S. Provisional Application No. 62/109,410, entitled "QUANTUM OTTO ENGINE" and filed on Jan. 29, 2015, the entire disclosure of which is hereby incorporated by reference.

TECHNICAL FIELD

This disclosure generally relates to quantum heat engines.

BACKGROUND

Current technologies for highly portable power systems can store energy in the form of un-reacted electrochemical components with potentials of a few electron volts per reaction. This limits the specific energy of such systems to a few megajoules per kilogram. Nuclear battery concepts can achieve a specific energy increase over electrochemical concepts but at the cost of ionizing radiation dangers, poor specific power by comparison to electrochemical solutions, and posing proliferation risks.

Techniques to store entropy rather than energy and to use entropy to improve energy harvesting from low quality sources have been proposed. For example, U.S. Pat. Pub. No. 2011/0252798, which is incorporated by reference in its entirety herein, describes systems and methods that use stored entropy to harvest energy using a "quantum heat engine" (QHE).

Quantum heat engines produce work using quantum matter as their working substance. A variety of theoretical QHEs have been proposed, such as those described in Scully et al., "Using Quantum Erasure To Exorcize Maxwell's Demon: I. Concepts And Context", Physica E 29 (2005) 29-39; and Rostovtsev, Yuri, et al., "Using Quantum Erasure To Exorcise Maxwell's Demon: II. Analysis", Physica E 29 (2005) 40-46; Ramandeep S. Johal, "Quantum Heat Engines And Nonequilibrium Temperature", Quant. Ph., 4394v1, September 2009; and Ye Yeo et al., "Quantum Heat Engines And Information", Quant. Ph., 2480v1, August 2007, each of which is incorporated herein by reference in its entirety. These theoretical quantum heat engines, however, can be impractical or impossible to reduce to practice and can be limited to use with either interacting or non-interacting working fluids and can be limited to use with either classical thermal reservoirs or quantum reservoirs.

Accordingly, there is a continued desire for improved quantum heat engines that can have interacting working fluids with enhanced quantum coherence and can be integrated to classical thermal baths as well as to effective baths with quantum noise or coherence to take advantage of quantum coherence and correlations for efficient work harvesting.

SUMMARY OF PARTICULAR EMBODIMENTS

The presently disclosed subject matter relates to quantum heat engines, and more particularly to quantum Otto engines that can have interacting working fluids with enhanced quantum coherence and can be integrated to classical thermal baths as well as to effective baths with quantum noise or coherence to take advantage of quantum coherence and correlations for efficient work harvesting.

In one aspect of the disclosed subject matter, a system for operating a quantum Otto cycle can include a superconducting LC resonator circuit electrically coupled to an input control unit. The input control unit can include a reservoir source and a waveform generator configured to generate a bias current. The system can include a superconducting flux qubit having at least two states tunably coupled to the LC resonator via a superconducting quantum interference device ("SQUID"). The SQUID can generate a flux in the presence of the bias current, and the flux generated by the SQUID can mediate a coupling rate between the superconducting flux qubit and the superconducting LC resonator. A seed coherence control unit can be inductively coupled to the superconducting flux qubit and adapted to produce a DC flux bias to couple the qubit states. A dilution refrigerator chamber can house the superconducting flux qubit and the superconducting LC resonator. The waveform generator can be configured to alternate the bias current to adiabatically change the coupling rate between the superconducting flux qubit and the superconducting LC resonator during adiabatic stages of the quantum Otto cycle. The reservoir source can be configured to send pulses to thermalize the superconducting flux qubit and the superconducting LC resonator system during isochoric stages of the quantum Otto cycle.

In certain embodiments the reservoir source comprises a quasi thermal field source. The quasi thermal field source can be thermally coupled to a first thermal reservoir having temperature $T_L$ and a second thermal reservoir having temperature $T_H$. The quasi thermal field source can be configured to send a first pulse to thermalize the superconducting flux qubit and the superconducting LC resonator system to temperature $T_L$ during a first isochoric stage of the quantum Otto cycle and can be configured to send a second pulse to thermalize the superconducting flux qubit and the superconducting LC resonator system to temperature $T_H$ during a second isochoric stages of the quantum Otto cycle.

In certain embodiments, the reservoir source can include at least one quantum reservoir characterized by a physical temperature parameter and a quantum parameter. Additionally or alternatively, the quantum reservoir can be characterized by an effective temperature based on the physical temperature and the quantum parameter. The effective temperature can be higher than the physical temperature. The quantum reservoir can include an ensemble of thermal squeezed photons or coherent photons, or a single qubit or qutrit with quantum coherence.

In another aspect of the disclosed subject matter, a method for operating a quantum Otto cycle can include using a qubit-resonator system comprising a superconducting flux qubit having at least two qubit states tunably coupled to a superconducting LC resonator. The method can include cooling the qubit-resonator system to its ground state using a dilution refrigerator chamber. The method can include applying a DC flux bias using a seed coherence control unit to couple the qubit states of the superconducting flux qubit. The method can include (i) thermalizing the qubit-resonator system to a temperature $T_H$ such that the first energy levels $E_n^H$ of the qubit-resonator system have first occupation probabilities $P_n(T_H)$; (ii) adiabatically shifting the energy levels of the qubit-resonator system to second energy levels $E_n^L$ by applying a bias current to vary the coupling rate between the superconducting flux qubit and the superconducting LC resonator from $g_H$ to $g_L$ or by applying an external magnetic flux to vary the excitation frequency of the superconducting LC resonator from $\omega_H$ to $\omega_L$; (iii) thermalizing the qubit-resonator system to temperature $T_L$ such that the second energy levels $E_n^L$ have the second occupation probabilities $P_n(T_L)$; and (iv) adiabatically shifting the energy levels of the qubit-resonator system back to first energy levels $E_n^H$ by altering the bias current to vary the coupling rate between the superconducting flux qubit and the superconducting LC resonator from $g_L$ to $g_H$ or by altering the external magnetic flux to vary the excitation frequency of the superconducting LC resonator from $\omega_L$ to $\omega_H$.

In certain embodiments, thermalizing the qubit-resonator system to a temperature $T_H$ can include thermally coupling the qubit-resonator system to a thermal reservoir having temperature $T_H$. Thermalizing the qubit-resonator system to a temperature $T_L$ can include thermally coupling the qubit-resonator system to a thermal reservoir having temperature $T_L$.

In certain embodiments, thermalizing the qubit-resonator system to a temperature $T_H$ or thermalizing the qubit-resonator system to a temperature $T_L$ can include coupling the qubit-resonator system to a quantum reservoir characterized by a physical temperature parameter and a quantum parameter. The quantum reservoir can be further characterized by an effective temperature, wherein the effective temperature is based on the physical temperature and the quantum parameter. The effective temperature is higher than the physical temperature. The quantum reservoir can include an ensemble of thermal squeezed photons or coherent photons, or a single qubit or qutrit with quantum coherence. In certain embodiments, the quantum reservoir can be adapted to thermalize the qubit-resonator system by injecting coherence using the seed coherence control unit and coupling the quantum reservoir to the superconducting flux qubit and the superconducting LC resonator system.

Figure 1:
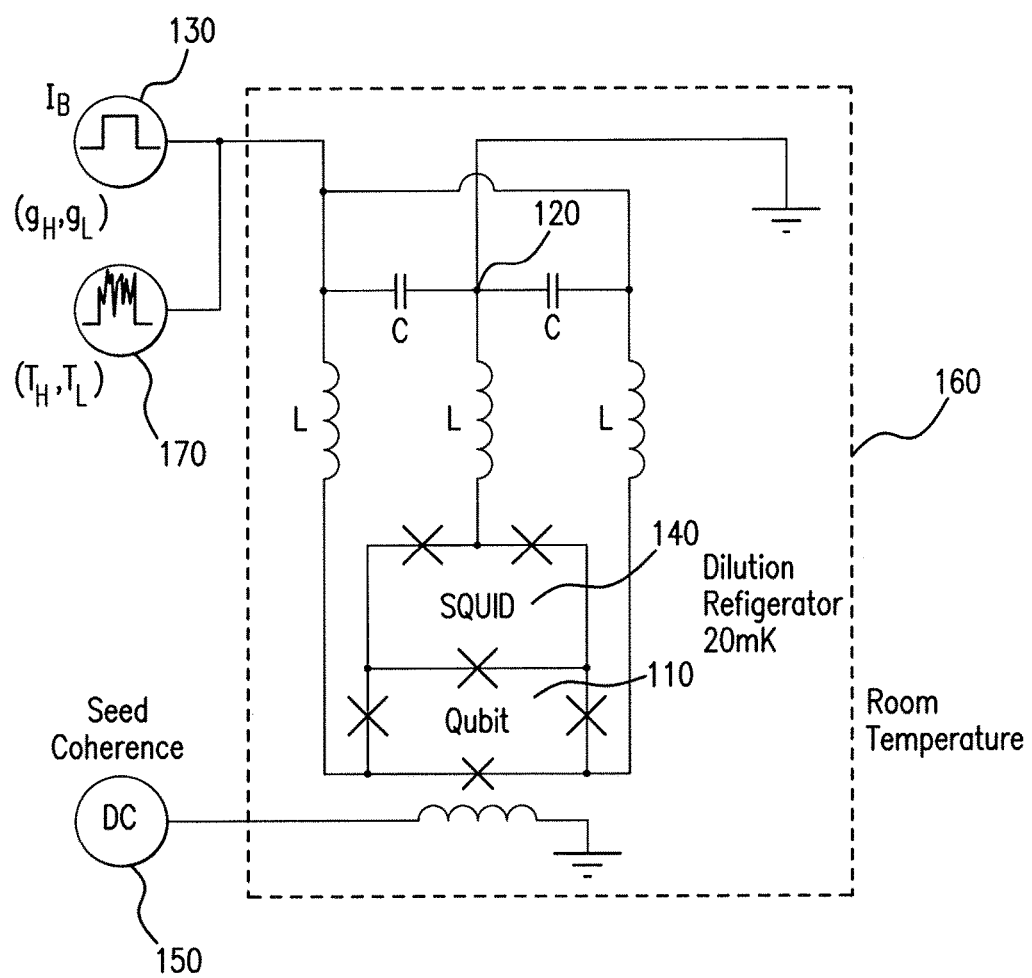
FIG. 1 is a schematic diagram of an example quantum heat engine in accordance with the disclosed subject matter.

Throughout the drawings, the same reference numerals and characters, unless otherwise stated, are used to denote like features, elements, components or portions of the illustrated embodiments. Moreover, while the disclosed subject matter will now be described in detail with reference to the figures, it is done so in connection with the illustrative embodiments.

DETAILED DESCRIPTION

Example embodiments of the disclosed subject matter are described below, with reference to the figures, for purposes of illustration, and not limitation.

Generally, QHEs in accordance with the disclosed subject matter can include a multilevel quantum heat engine with a working medium described by a generalized Rabi model comprising a two-level system coupled to a single mode bosonic field. QHEs in accordance with the disclosed subject matter can realize different thermodynamic cycles, such as the Otto Cycle, the Carnot Cycle or the Brayton Cycle. For purpose of illustration, and not limitation, description is made herein of QHEs that can operate in a quantum Otto cycle. It will be appreciated by those of skill in the art, however, that QHEs operating in other thermodynamic cycles can be realized based on the disclosed subject matter and that the scope of the claims is not intended to be so limited.

For purpose of illustration, and not limitation, example embodiments of the disclosed subject matter are described with reference to FIGS. 1-5.

As embodied herein, QHEs operated in a quantum Otto Cycle can include superconducting circuits coupled to superconducting quantum bits ("qubits"). A quantum Otto engine can operate as an analog of four stroke classical Otto engine. The strokes or stages can include two isochoric and two adiabatic stages. One isochoric stage can be followed by an adiabatic stage. Generally, in accordance with the disclosed subject matter, a coupled qubit-resonator system can evolve subject to four time controlled stages in cyclic manner. At the isochoric stages the system can be brought in contact with high and low temperature baths at temperatures $T_H$ and $T_L$, respectively. In the adiabatic stages the coupling rate, g, can be changed from a value $g_L$ to $g_H$ and then from $g_H$ to $g_L$. Additionally or alternatively, in the adiabatic stages the excitation frequency can be changed from a value of $\omega_L$ to $\omega_H$ and then from $\omega_H$ to $\omega_L$.

In accordance with the disclosed subject matter, with reference to FIG. 1, a system for operating a quantum Otto cycle can include a superconducting flux qubit 110 tunably coupled to a superconducting LC resonator 120 in the deep ultra strong regime. The coupling can be tunable in order to implement the adiabatic stages of the quantum Otto cycle. Operation of the engine can benefit from the deep ultra strong regime where the coupling is comparable to the frequency of the resonator 120. The resonator 120 and the qubit 110 can be in resonance for efficient coupling. In this embodiment, the coupling rate can be tuned independent of the frequency of the resonator 120. In certain embodiments the adiabatic stages can be implemented by tuning the qubit 110 and resonator 120 frequencies independent from the coupling or coupling can be tuned simultaneously with the frequencies.

The superconducting flux qubit 110 can be tunably coupled to the resonator 120 using a variety of suitable techniques known to those skilled in the art. For example, the superconducting flux qubit 110 can have at least two states tunably coupled to the LC resonator via a superconducting quantum interference device ("SQUID") 140. The flux qubit 110 and SQUID 120 can include a plurality of Josephson Junctions arranged such that the SQUID can generate a flux in the presence of the bias current 130, and the flux generated by the SQUID can mediate a coupling rate between the superconducting flux qubit 110 and the superconducting LC resonator 120. A multi-loop qubit system for tunable ultra strong coupling, such as that described in B. Peropadre et al., 2010, Physical Review Letters 105, 023601, which is incorporated by reference herein in its entirety, can also be used. Additionally or alternatively, coupling between a flux qubit and an LC resonator using the techniques disclosed in S. Gustayson et al., 2012, Physical Review Letters 108, 170503, which is incorporated by reference herein in its entirety, can also be used. The coupling can be in the strong coupling regime where it is about two orders of magnitude smaller than the resonator frequency.

In an example embodiment, the qubit 110 and the resonator 120 can be coupled in the deep ultra strong coupling regime. In this embodiment, a multi-loop flux qubit 110 system can be galvanically coupled to a narrow aluminum strip interrupted with a large-area Josephson junction which serves as a part of the central conductor of a niobium coplanar wave guide resonator such as described T. Niemczyk et al., 2010, Nature Physics 6, 772, which is incorporated by reference herein in its entirety. In connection with this embodiment, the achieved coupling rate can be approximately one order of magnitude less than the resonator frequency and can fall into the ultra strong coupling regime. One of skill in the art will appreciate that other suitable techniques to enhance the coupling regime, such as those disclosed in B. Peropadre et al., 2013, Physical Review Letters 111, 243602, which is incorporated by reference herein in its entirety, can also be used.

In certain embodiments, the flux qubit 110, resonator 120, and/or SQUID 140 can be fabricated from aluminum and/or niobium. For example, the flux qubit 110 can be formed from aluminum and the resonator 120 can be a niobium coplanar waveguide resonator. Additionally and/or alternatively, the flux qubit 110, resonator 120, and/or SQUID 140 can be fabricated using more complex materials of high temperature superconductors such as YBCO or Bi2Sr2CaCu2O8+x.

In accordance with the disclosed subject matter, the superconducting LC resonator circuit 120 can be electrically coupled to an input control unit. The input control unit can include a reservoir source and a waveform generator configured to generate a bias current 130. The tuning can be controlled by the bias current IB 130. Without the bias current 130 there is no coupling. In the presence of magnetic field, bias current 130 can controls the flux generated by the SQUID 140 which in turn can mediate the interaction between the qubit 110 and the resonator 120. An arbitrary waveform generator can be used to generate desired time dependent bias current 130 pulses to implement the two adiabatic stages of the Otto cycle.

Additionally or alternatively, in connection with certain embodiments, the tuning of the coupling between the qubit 110 and the resonator 120 can be accomplished with direct threading of a bias flux into the SQUID loop 140. The qubit 110 can include a two-loop qubit design for tunable coupling, which can provide flexibility in the type, strength and orientation of coupling. However, one of skill in the art will appreciate that tunable coupling can also be achieved with more than two loops in the qubit system.

A seed coherence 150 control unit can be inductively coupled to the superconducting flux qubit 110 and adapted to produce a DC flux bias to couple the qubit states. Without the other parts of the system, the seed coherence 150 can drive the qubit 110 into a coherent superposition of its two states. This quantum coherence can be small. The resonator system 120 can be coherently coupled to the qubit 110 such that the seed coherence is enhanced. The seed coherence control unit 150 can provide enhanced coherence within the working substance to allow for operation of a quantum coherent heat engine.

A dilution refrigerator chamber 160 can house the superconducting flux qubit 110 and the superconducting LC resonator 120. One of skill in the art will appreciate that different temperature regimes can be applied to superconducting circuit devices. For example, the materials aluminum and niobium are low temperature superconductors. In connection with these materials, a dilution refrigerator 160 suitable to cool the qubit 110 and the resonator 120 parts of the engine down to around 20 mK can be used. In certain embodiments, the control units, the arbitrary wave form generator for the bias current 130 for adiabatic stages and a white noise generator or a quasi thermal field source for the thermalization stages of the engine cycle can be kept at room temperature. The system can be probed using measuring SQUID magnetometers kept around 4K temperature for testing the operation and qubit state.

The waveform generator can be configured to alternate the bias current 130 to adiabatically change the coupling rate between the superconducting flux qubit 110 and the superconducting LC resonator 120 during adiabatic stages of the quantum Otto cycle. The reservoir source can be configured to send pulses 170 to thermalize the superconducting flux qubit 110 and the superconducting LC resonator 120 system during isochoric stages of the quantum Otto cycle.

Figure 2:
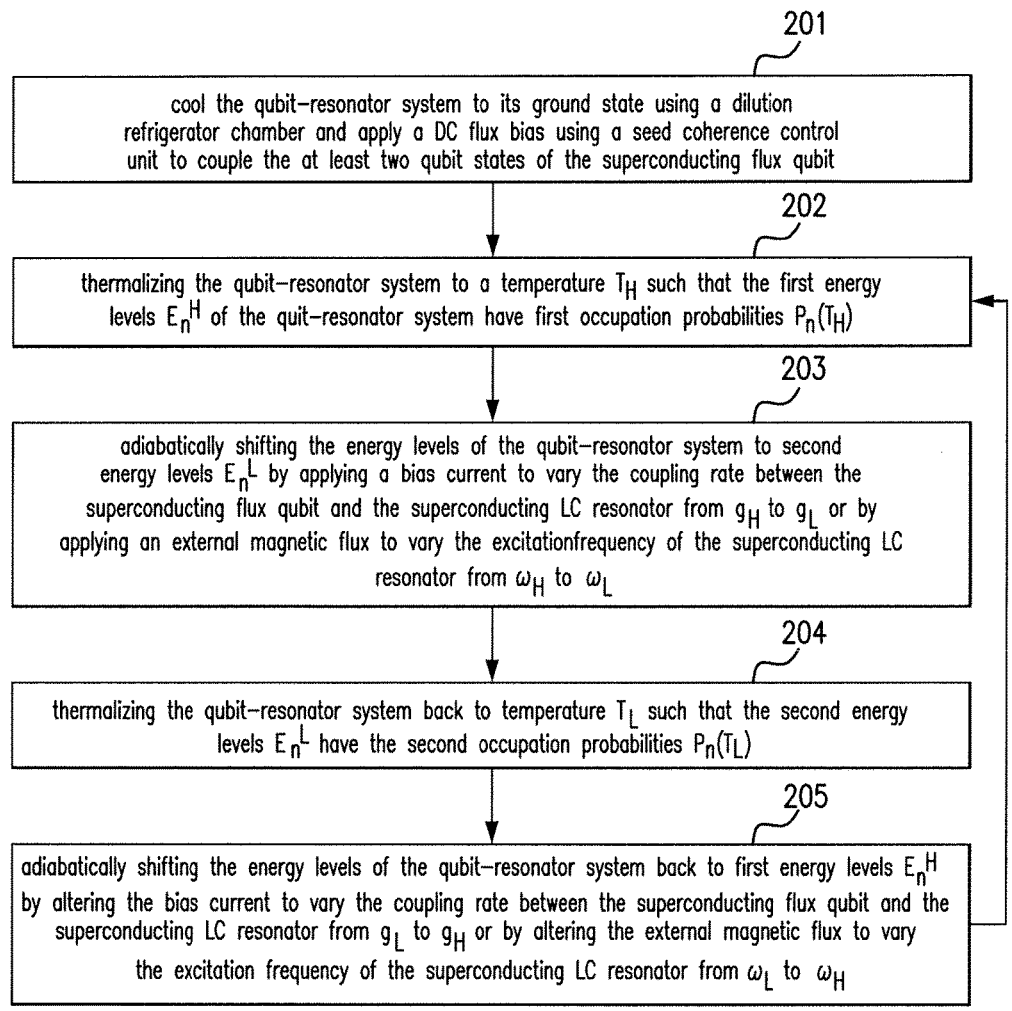
FIG. 2 is a flow diagram of an example method for operating a quantum heat engine in accordance with the disclosed subject matter.

In accordance with the disclosed subject matter, and with reference to FIG. 2, a quantum Otto engine, such as described herein with reference to FIG. 1, can be operated as follows. The qubit-resonator system can be cooled (201) to its ground state using a dilution refrigerator chamber 160. At this time, no bias current 130 need be applied and the resonator can be empty. Seed coherence 150 can be turned on at this stage and kept on during the operation of the engine. After the engine is configured in the ground state, the four stages of an Otto Cycle can be accomplished.

The first stage corresponds to ignition stage or contact with the hot bath stage of the Otto cycle. In this stage, the qubit-resonator system can be thermalized (202) to a temperature $T_L$ such that the first energy levels $E_n^H$ have first occupation probabilities $P_n(T_H)$. For example, in certain embodiments, a quasi thermal field source (170) can be used as a first thermal reservoir having temperature $T_H$. The quasi thermal field source can be configured to send a first pulse (e.g., pulse 170) to thermalize the superconducting flux qubit 110 and the superconducting LC resonator 120 system to temperature $T_H$. Throughout the thermalization process, the coupling rate is kept constant value of $g_H$ by a constant bias current.

Instead of thermal noise bath, a quantum reservoir can be used. Such a reservoir can be an ensemble of thermal squeezed or coherent photons, or a single qubit or qutrit with quantum coherence. In either case the bath can be characterized with two parameters, one is the physical temperature "$T_{bath}$" and the other is a quantum parameter, for example "r" for the degree of squeezing or $\phi$ for the coherent superposition phase. Such a quantum contribution could be made to lead to higher number of steady state photons in the resonator than the case where only thermal reservoir at the temperature $T_{bath}$ is used. Steady state photons can be described by an effective thermal distribution. Accordingly, the quantum bath can be described with a single parameter, an effective temperature "$T_{eff}$" which is a function of $T_{bath}$ and the quantum parameter. The quantum parameter can be chosen to achieve $T_{eff} > T_{bath}$. From this perspective, a quantum bath is not much different than a classical bath, but can allow for effectively higher temperatures. In this manner, a single bath can be used during a thermodynamic cycle as if there are two baths at different temperatures required for work extraction by simply turning on and off quantum parameter contribution of a single bath.

Figure 3A:
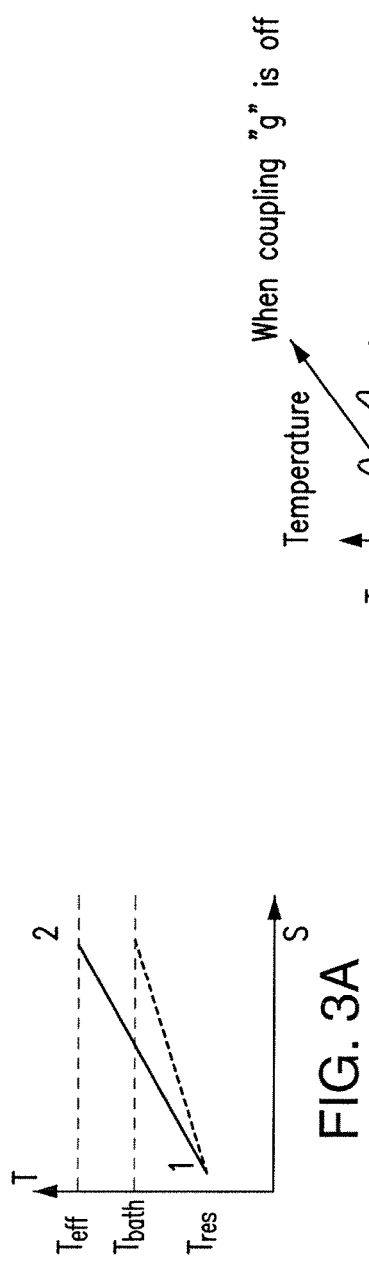
FIG. 3A illustrates isochoric heating using classical thermal baths and quantum reservoirs in accordance with the disclosed subject matter.
Figure 3B:
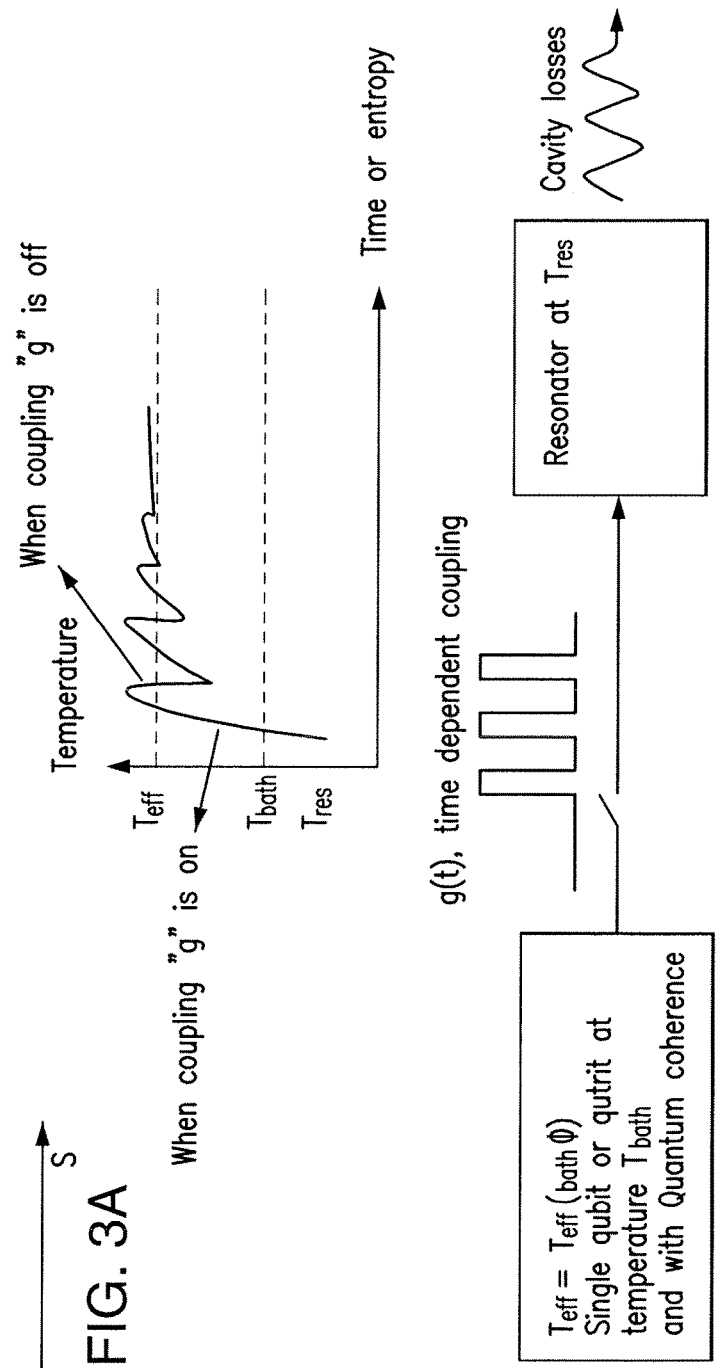
FIG. 3B illustrates isochoric heating using a single qubit or qutrit in accordance with the disclosed subject matter.

FIG. 3A depicts a T-S diagram for a quantum reservoir. At (1) the resonator photons are in thermal equilibrium at temperature $T_{res}$. The quantum bath at temperature $T_{bath}$ is then coupled with the resonator. The number of resonator photons increases towards a steady state value. The saturated steady state value can be described by a thermal equilibrium distribution at an effective temperature $T_{eff}$. In the T-S diagram, this equilibrium point is shown to be (2). Between (1) and (2) the process is an isochoric heating. The resonator frequency, whose inverse can be considered as an effective resonator volume is kept constant. The dashed line illustrates the case of classical isochoric heating. FIG. 3B illustrates the process for the case of isochoric heating of the resonator using a single qubit or qutrit.

Pulses generated by the quasi thermal field source can be squeezed before sending them onto the resonator. Thermal noise generators coupled to nonlinear amplifiers can be used for this purpose. During the interaction time of the squeezed thermal photons and the resonator, the bias current can be kept constant to keep the coupling coefficient "g" constant, and the resonator and the qubit frequencies can also be kept constant. This can ensure that energy level structure remains the same during the quantum isochoric process. The hybrid system of qubit and the resonator will not be in equilibrium during the process but eventually will reach a steady state at the end which can be described by a thermal distribution at an effective temperature. The effective temperature can depend on the squeezing parameter and can be made larger than the physical temperature of the thermal noise.

In the case of single qubit or qutrit quantum bath, the thermal field source can be turned off. Qubit or qutrit at temperature $T_{bath}$ and in coherent superposition can be used as a heat bath instead of squeezed thermal photons. Seed coherence by the DC field can be used to inject required coherence to the qubit or qutrit. In order to thermalize the resonator photons, the qubit or qutrit can be coupled and decoupled sequentially many times to the resonator. This can be accomplished, for example, by altering the bias current periodically. When the coupling is on, a number of thermal photons are added; when the coupling is off the resonator cools. At the end, a steady state can be reached as a function of coherence parameter and $T_{bath}$, which can be described as a thermal distribution at an effective temperature $T_{eff} > T_{bath}$.

The second stage corresponds to adiabatic expansion stage of the Otto cycle. In this stage, the energy levels of the qubit-resonator system can be adiabatically shifted (203) to second energy levels $E_n^L$ by applying a bias current 130 to vary the coupling rate between the superconducting flux qubit 110 and the superconducting LC resonator 120 from $g_H$ to $g_L$. Alternatively, the energy levels of the qubit-resonator system can be adiabatically shifted (203) to second energy levels $E_n^L$ by applying an external magnetic flux to vary the excitation frequency of the superconducting LC resonator from $\omega_H$ to $\omega_L$.

The third stage corresponds to exhaust stage or cold bath contact of the Otto cycle. In this stage, the qubit-resonator system can be thermalized (204) back to temperature $T_L$ such that the second energy levels $E_n^L$ have the second occupation probabilities $P_n(T_L)$. For example, in certain embodiments, a quasi thermal field source can be used as a second thermal reservoir having temperature $T_L$. The quasi thermal field source can be configured to send a second pulse (e.g., pulse 170) to thermalize the superconducting flux qubit 110 and the superconducting LC resonator 120 system to temperature $T_L$. Additionally or alternatively, a quantum reservoir as described herein can be coupled to the qubit-resonator system for thermalization. Throughout the thermalization process, the coupling rate is kept constant value of $g_L$ by a constant bias current.

The fourth stage corresponds to adiabatic compression stage of the Otto cycle. In this stage, the energy levels of the qubit-resonator system can be adiabatically shifted (205) back to first energy levels $E_n^H$ by altering the bias current 130 to vary the coupling rate between the superconducting flux qubit 110 and the superconducting LC resonator 120 from $g_L$ to $g_H$. Alternatively, the energy levels of the qubit-resonator system can be adiabatically shifted (205) back to first energy levels $E_n^H$ by altering the external magnetic flux to vary the excitation frequency of the superconducting LC resonator from $\omega_L$ to $\omega_H$.

In certain embodiments of the disclosed subject matter, quantum information can be fed into the quantum heat engines described herein using quantum information baths. For example, quantum information baths such as "coherence capacitors" described in U.S. Pat. Pub. No. 2011/0252798, which is incorporated by reference in its entirety herein, can be used in accordance with the disclosed subject matter. For example, and not limitation, one of the heat baths, implemented with the quasi thermal field source with thermal noise, can be replaced with a quantum information bath with quantum coherence, such as coherent single photon states or squeezed thermal states. A quantum information bath of squeezed thermal states, for example, has been shown that it can lead efficiency beyond Carnot limit in J. Roβnagel et al., 2014, Physical Review Letters 112, 030602, which is incorporated by reference in its entirety herein.

In alternative embodiments one of the heat baths can be completely removed and the qubit can be used as an effective bath in the spirit of the phaesonium engine proposed by M. O. Scully et al., 2003, Science 299, 862, which is incorporated by reference in its entirety herein. In this case a three level qubit, namely a qutrit, can be used. Flux qutrits are available with various level schemes, such as those reviewed in by J. Q. You and F. Nori, 2011, Nature 474, 589, which is incorporated by reference in it entirety. Quantum heat engines in accordance with the disclosed subject matter can be used to realize phaesonium engines as well by operating the flux qubit in strong coupling regime and as a qutrit, and by removing the thermal baths, implemented by quasi thermal field source. The seed coherence control unit can be used to prepare the qutrit with initial coherence between the lower level doublet as required for quantum coherence bath.

Figure 5:
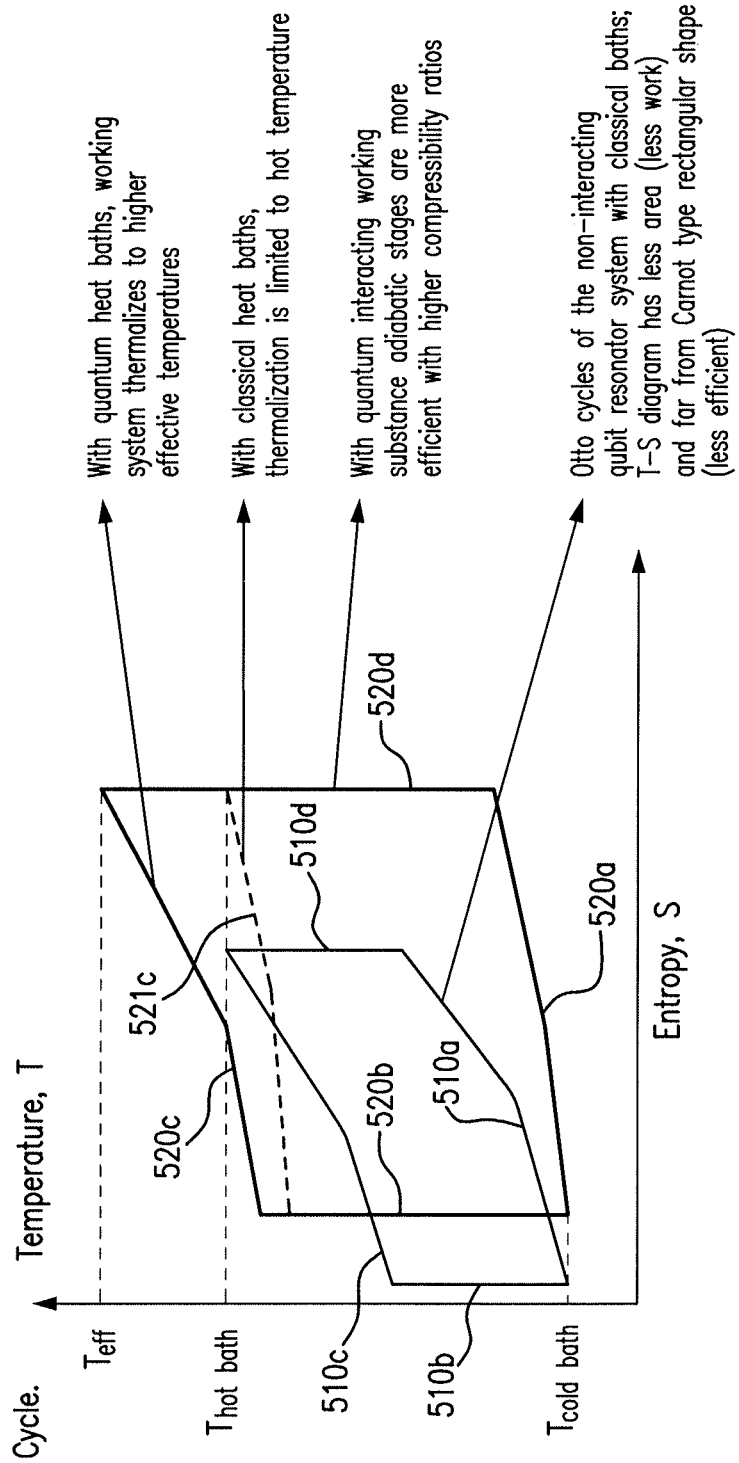
FIG. 5 is a T-S diagram illustrating quantum Otto cycles using quantum heat baths, classical heat baths, quantum interacting working substances, and non-interacting qubit resonators in accordance with the disclosed subject matter.

As described herein, the disclosed subject matter provides quantum heat engines that can have interacting working fluids with enhanced quantum coherence and can be integrated to classical thermal baths as well as to effective baths with quantum noise or coherence to take advantage of quantum coherence and correlations for efficient work harvesting. FIG. 5 provides T-S diagrams illustrating the quantum Otto cycles using quantum heat baths, classical heat baths, quantum interacting working substances, and non-interacting qubit resonators. For example, in connection with the Otto cycle of a non-interacting qubit resonator system with classical baths, the first isochoric step (as described with reference to element 202 of FIG. 2) is shown in the T-S diagram of FIG. 5 by line 510c. The adiabatic step (as described with reference to elements 203 and 205 of FIG. 2) are shown by lines 510d and 510b, respectively; the second isochoric step (described with reference to element 204 of FIG. 2) is shown by line 510a.

As illustrated by FIG. 5, in connection with the Otto cycle of a quantum interacting work substance, the adiabatic stages 520b and 520d are more efficient with higher compressibility ratios. Similarly, in connection with quantum heat baths as opposed to classical heat baths, the isochoric stages 520a and 520c thermalize to higher effective temperatures. Line 521c illustrates the thermalization for a quantum interacting working substance with classical heat baths. As illustrated by line 521c, thermalization is limited to the hot bath temperature when classical heat baths are used.

For purpose of illustration, and not limitation, quantum heat engines in accordance with embodiments of the disclosed subject matter can benefit from quantum coherence in at least two ways. First, the quantum coherence can be injected from an external source, a quantum heat bath, and used as a resource, a quantum fuel, such as phaseonium. Second, quantum coherence can be generated in the interacting working fluid. Embodiments of quantum coherence Otto engines described herein can flexibly operate both with quantum fuel and an interacting working fluid. It can benefit from both sources of quantum coherence.

For example, and not limitation, in an example embodiment, the working fluid can consist of a single qubit and the resonator photons. Alternatively, the working fluid consist of the resonator photons alone, when the qubit is used as a quantum heat bath, as the phaseonium fuel. Qubit-photon interaction can induce quantum coherence in the working fluid. If the qubit has small seed coherence, the induced coherence can be significantly enhanced.

For purpose of illustration, and not limitation, the amplification of the coherence can be analogized to the Huygens clocks mechanism. The qubit can act as the central spin coupled to the surrounding spins to make a quantum synchronization for their global coherence. The resonator field can act as the surrounding large spin ensemble in the continuum limit. The interaction induced and amplified coherence in the working fluid can be translated into large amount of quantum information, which can be characterized as quantum entanglement, mutual information, discord or correlations in more general terms. Bringing system to smaller size can increase "quantumness." A working fluid with a significant amount of quantum information can be squeezed more efficiently and reach higher temperatures at the end of the adiabatic compression.

In the subsequent ignition stage, the working fluid can be brought in contact with a hot bath, which can reduce the "quantumness" of the system. Quantum information in the working fluid can be erased. Due to the information gradient between the initial and final points of the ignition stage, more heat can be absorbed from the environment. As a result, the interacting working fluid can have strong quantum pressure at the end of the ignition stage and expand efficiently in the power stroke. Non-interacting working fluid cannot generate quantum correlations and hence cannot exploit its advantages in the compression and ignition stages.

Quantum information in the interacting working fluid can be subject to decoherence. The decoherence channels include, for example, cavity loss and qubit dephasing. One of skill in the art will appreciate that typical superconductor resonator loss rates can be about 1 MHz, which is several orders of magnitude smaller than the qubit-cavity interaction rate. See, for example, A. Wallraff et al., Nature 431, 162 (2004) and P. Forn Diaz et al., Phys. Rev. Lett. 105, 237001 (2010), which is incorporated by reference in its entirety herein. The coherence can be amplified faster than the decay. The qubit can be acted upon by a bias field continuously to preserve the small seed coherence in the presence of dephasing. To reduce operational cost of constant bias field and to improve preservation of the seed coherence a quantum control method based upon quantum Zeno effect and non-Markovian coupling to baths can be used in connection with certain embodiments, such as described in N. Erez et al., Nature 452, 724 (2008), which is incorporated by reference herein in its entirety.

Alternatively or additionally, in certain embodiments, more than one seed coherence qubit or multi level qudits can be used in which case the Rabi model will translate into Dicke or Tavis-Cummings models where the superradiant transfer rates scale quadratically with the number of qubits. See, for example, B. M. Garraway, Phil. Trans. R. Soc. 369, 1137 (2011), which is incorporated herein by reference in its entirety. Using multilevel qudits or multiple qubits as quantum heat bath can translate the quadratic scaling with the number of coherent resources into the work output of the engine. Using a combination of multi level and multiple qubits in certain quantum coherent states can lead to faster power laws, such as cubic or the fourth power of the number of qubits, such as described in G. S. Agarwal, Phys. Rev. A 83, 023802 (2011), which is incorporated herein by reference in its entirety.

Additionally or alternatively, certain embodiments can utilize electron or nuclear spin ensembles, such as NV (Nitrogen Vacancy) centers in diamond, for their larger number of qubits as well as longer coherence times as will be appreciated by those of skill in the art. See, e.g. R. Amsüss et al., Phys. Rev. Lett. 107, 060502, which is incorporated by reference herein in its entirety. Those of skill in the art will likewise appreciate that demonstrations of strong couplings are available with solutions to suppress the inhomogeneous broadening, including those described in S. Putz et al., Nature Phys. 10, 720 (2014) and A. W. Eddins et al., Phys. Rev. Lett. 112 120501 (2014), each of which is incorporated by reference herein in their entirety. Similarly, those of skill in the art will appreciate the existence of superradiant phase in the hybrid system of NV centers coupled to superconducting resonator with decoherence. See, for example, L. J. Zou et al., Phys. Rev. Lett. 113, 023603 (2014), which is incorporated by reference herein in its entirety. A Quantum Coherent Otto Engine in accordance with an example embodiment of the disclosed subject matter can achieve a favorable scaling law in work harvesting, which can be close to the nature's solution to dephasing and decoherence in light harvesting complexes by cooperative robustness via superradiance, as described, for example, in G. Luca Celardo et al., Phys. Rev. B 90, 075113 (2014), which is incorporated by reference herein in its entirety.

For purpose clarity, and not limitation, additional description of a quantum Otto Cycle in accordance with the disclosed subject matter is provided herein.

Figure 4:
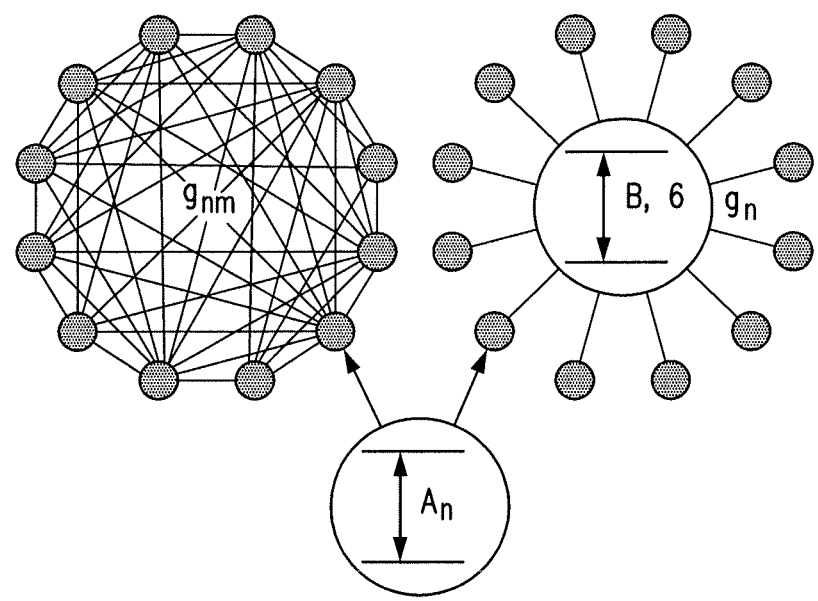
FIG. 4 is a schematic diagram of the coupling involved in complexes of N two-level systems.

The design of quantum heat engines as disclosed herein as a generalized Rabi model is based upon the model of N interacting chromophores (pigments) in light harvesting photosynthetic complexes. Such complexes have an electronic Heitler-London Hamiltonian, $H_e$, which can be given by:

$$H_e = \sum_{n=1}^{N} \Delta_n \sigma_n^\dagger \sigma_n + \sum_{n>m}^{N} g_{nm}(\sigma_n^\dagger \sigma_m + \sigma_m^\dagger \sigma_n), \quad (1)$$

where $\Delta_n$ is the excitation energy of the localized two-level chromophore at site n and $g_{nm}$ is the dipolar coupling describing the electronic excitation transfer between chromophores at sites n and m. The Pauli spin operators $\sigma_n$ and $\sigma_n^\dagger$ are the annihilation and creation operators of electronic excitations at site n. In the complex the chromophores are typically distributed on a ring and all the sites are coupled to each other as depicted in FIG. 4.

Two-level pigments distributed on the ring act as an antenna complex and the long range interactions in the system contribute for quantum coherence enhanced solar energy harvesting. Single excitations, Frenkel excitons, are delocalized over the sites for coherent transfer of the energy through the complex. In accordance with the disclosed subject matter, an alternative structure is described which can establish coherent coupling of two level systems indirectly. A single central pigment with a small amount of coherence, $\epsilon$, coupled to a large ensemble of non-interacting pigments can be represented with the Hamiltonian:

$$H = \Delta \sigma^\dagger \sigma + c(\sigma^\dagger + \sigma) + \sum_{n=1}^{N} \Delta_n \sigma_n^\dagger \sigma_n + \sum_{n=1}^{N} g_n(\sigma_n^\dagger \sigma + \sigma^\dagger \sigma_n), \quad (2)$$

where $\Delta$ is the energy of the central cite and $g_n$ is the coupling coefficient of the site n to the central one. The second term yields a quantum superposition of two levels of the central pigment and establishes a small amount of coherence in the central site. This local coherence is distributed over the other sites by interactions. Participation of many sites to such a delocalized coherence is then amplifies the global coherence of the complex to enhance its operational efficiency. This strategy can be easier to implement in synthetic energy harvesting systems as it would not require long range coupling of all sites.

Distribution of surrounding pigments about the central one can be assumed radially uniform so that identical coupling coefficients can be taken as $g_n = g_0$. Operators can be defined to described annihilation and creation of collective excitations, and if the number of pigments is much larger than the excitation number, the operators can describe bosonic excitations, analogs of magnons of spin waves. The coupling coefficient can thus be collectively enhanced, and can be given as $g=\text{sqrt}(N)g_0$. Using defined operators, the model can become a generalized Jaynes-Cummings model (JCM). If the interaction coefficient g can be comparable to excitation energy $\omega$, the JCM can be generalized to a more generic spin-boson model, known as the Rabi model. In connection with the disclosed subject matter, a generalized Rabi Hamiltonian can be given as:

$$H = \Delta \sigma_z + \epsilon \sigma_x + \omega a^\dagger a + g \sigma_x (a + a^\dagger),$$

The seed coherence introduces a $Z_2$ symmetry breaking effect to the model. This generalized Rabi model can thus be characterized by two parameters, frequency $\omega$ and coupling rate g.

In this manner, a quantum Otto cycle can be operated using a generalized Rabi model. The first stage is a quantum isochoric process. The working medium with ($\omega=\omega_h$; $g=g_h$) is brought in contact with a hot thermal reservoir at temperature $T=T_h$. An amount of heat $Q_1$ is absorbed from the heat bath; but no work is done during the stage. The energy levels remain the same $E_n = E^h_n$ while the occupation probabilities change to $P_n(T_h)$ in thermal equilibrium. The second stage is a quantum adiabatic expansion process. The working medium is isolated from the heat reservoir and its energy levels are shifted adiabatically from $E^h_n$ to $E_n = E^l_n$ either by varying $\omega_h$ to $\omega_l$ or by varying to $g_h$. No heat is transferred; but an amount of work is done during the stage. The occupation probabilities remain unchanged by the adiabatic theorem. The third stage is another quantum isochoric process where the working medium with ($\omega=\omega_l$; $g=g_l$) is brought to contact with a cold entropy sink at $T=T_l$. An amount of heat $Q_2$ is released to the reservoir; but no work is done. Attaining thermal equilibrium changes the occupation probabilities to $P_n(T_l)$, but maintains the energy structure with $E_n = E^l_n$. In the fourth stage, the working medium goes through a quantum adiabatic contraction process. The energy levels are shifted back to $E^h_n$ either by changing $\omega_l$ to $\omega_n$ or $g_l$ to $g_h$. The occupation probabilities are preserved by the quantum adiabatic theorem while work is done due to changing energy levels during the stage.

This generalized Rabi model can be implemented as described herein above. For example, and not limitation, the central two-level site can be implemented by a flux qubit and the representative bosonic fields of the weakly excited ensemble of two-level sites can be effectively implemented by a superconducting waveguide resonator mode. The magnetic energy of the qubit and the qubit gap correspond to $\epsilon$ and $\Delta$, respectively. For a typical resonator frequency $\omega/2\pi \sim 6$-9 GHz, $\epsilon \sim 0.005\omega \sim 30$-45 MHz, which is around the edge of the qubit linewidth. The qubit bare energy $\omega$ can be tuned over a wide range by an external magnetic flux. The coupling coefficient could be varied in the range $g/2\pi \sim 10$ MHz-1 GHz; while theoretical studies suggest that g can be up to $g \sim 3\omega$.

Thermal baths can be implemented by using a dilution refrigerator to cool the resonator to empty resonator limit and applying a thermal radiation at the input of the transmission line resonator which can lead to temperatures in the range of $\sim 100$-7500 mK. For the optimal low T for QHEs as described herein, $T_l$ can be $<1\sim 300$ 450 mK.

The presently disclosed subject matter is not to be limited in scope by the specific embodiments herein. Indeed, various modifications of the disclosed subject matter in addition to those described herein will become apparent to those skilled in the art from the foregoing description and the accompanying figures. Such modifications are intended to fall within the scope of the appended claims.

What is claimed is:

1. A system for operating a quantum Otto cycle, comprising:
    a superconducting LC resonator circuit electrically coupled to an input control unit, the input control unit including a reservoir source and a waveform generator configured to generate a bias current;
    a superconducting flux qubit having at least two states tunably coupled to the LC resonator via a superconducting quantum interference device ("SQUID"), wherein the SQUID generates a flux in the presence of the bias current, and wherein the flux generated by the SQUID mediates a coupling rate between the superconducting flux qubit and the superconducting LC resonator;
    a seed coherence control unit inductively coupled to the superconducting flux qubit and adapted to produce a DC flux bias to couple the at least two qubit states; and
    a dilution refrigerator chamber for housing the superconducting flux qubit and the superconducting LC resonator;
    wherein the waveform generator is configured to alternate the bias current to adiabatically change the coupling rate between the superconducting flux qubit and the superconducting LC resonator during adiabatic stages of the quantum Otto cycle; and wherein the reservoir source is configured to send pulses to thermalize the superconducting flux qubit and the superconducting LC resonator system during isochoric stages of the quantum Otto cycle.

2. The quantum heat engine of claim 1, wherein the reservoir source comprises a quasi thermal field source.

3. The quantum heat engine of claim 2, wherein the quasi thermal field source is thermally coupled to a first thermal reservoir having temperature TL and a second thermal reservoir having temperature TH, and wherein the quasi thermal field source is configured to send a first pulse to thermalize the superconducting flux qubit and the superconducting LC resonator system to temperature TL during a first isochoric stage of the quantum Otto cycle and configured to send a second pulse to thermalize the superconducting flux qubit and the superconducting LC resonator system to temperature TH during a second isochoric stages of the quantum Otto cycle.

4. The quantum heat engine of claim 1, wherein the reservoir source comprises at least one quantum reservoir characterized by a physical temperature parameter and a quantum parameter.

5. The quantum heat engine of claim 4, wherein the quantum reservoir is further characterized by an effective temperature, wherein the effective temperature is based on the physical temperature and the quantum parameter, and wherein the effective temperature is higher than the physical temperature.

6. The quantum heat engine of claim 4, wherein the quantum reservoir comprises one or more of an ensemble of thermal squeezed photons or coherent photons, or a single qubit or qutrit with quantum coherence.

7. The quantum heat engine of claim 4, wherein the quantum reservoir is adapted to thermalize the superconducting flux qubit and the superconducting LC resonator system by injecting coherence using the seed coherence control unit and coupling the quantum reservoir to the superconducting flux qubit and the superconducting LC resonator system.

8. A method for operating a quantum Otto cycle using a qubit-resonator system comprising a superconducting flux qubit having at least two qubit states tunably coupled to a superconducting LC resonator via a superconducting quantum interference device ("SQUID"), comprising:
cooling the qubit-resonator system to its ground state using a dilution refrigerator chamber;
applying a DC flux bias using a seed coherence control unit to couple the at least two qubit states of the superconducting flux qubit;
thermalizing the qubit-resonator system to a first temperature such that a plurality of first energy levels of the qubit-resonator system have first occupation probabilities;
adiabatically shifting the first energy levels of the qubit-resonator system to a second plurality of second energy levels by applying a bias current to the SQUID to vary the coupling rate between the superconducting flux qubit and the superconducting LC resonator from a first coupling rate to a second coupling rate;
thermalizing the qubit-resonator system to a second temperature such that the second energy levels have second occupation probabilities;
adiabatically shifting the second energy levels of the qubit-resonator system back to the first energy levels by altering the bias current to the SQUID to vary the coupling rate between the superconducting flux qubit and the superconducting LC resonator from the second coupling rate to the first coupling rate.

9. The method of claim 8, wherein thermalizing the qubit-resonator system to the first temperature includes thermally coupling the qubit-resonator system to a thermal reservoir having a temperature equal to the first temperature.

10. The method of claim 8, wherein thermalizing the qubit-resonator system to the second temperature includes thermally coupling the qubit-resonator system to a thermal reservoir having a temperature equal to the second temperature.

11. The method of claim 8, wherein at least one of thermalizing the qubit-resonator system to the first temperature and thermalizing the qubit-resonator system to the second temperature includes coupling the qubit-resonator system to a quantum reservoir characterized by a physical temperature parameter and a quantum parameter.

12. The method of claim 11, wherein the quantum reservoir is further characterized by an effective temperature, wherein the effective temperature is based on the physical temperature and the quantum parameter, and wherein the effective temperature is higher than the physical temperature.

13. The method of claim 11, wherein the quantum reservoir comprises one or more of an ensemble of thermal squeezed photons or coherent photons, or a single qubit or qutrit with quantum coherence.

14. The method of claim 11, wherein the quantum reservoir is adapted to thermalize the qubit-resonator system by injecting coherence using the seed coherence control unit and coupling the quantum reservoir to the superconducting flux qubit and the superconducting LC resonator system.

15. A method for operating a quantum Otto cycle using a qubit-resonator system comprising a superconducting flux qubit having at least two qubit states tunably coupled to a superconducting LC resonator, comprising:
cooling the qubit-resonator system to its ground state using a dilution refrigerator chamber;
applying a DC flux bias using a seed coherence control unit to couple the at least two qubit states of the superconducting flux qubit;
thermalizing the qubit-resonator system to a first temperature such that a plurality of first energy levels of the qubit-resonator system have first occupation probabilities;
adiabatically shifting the first energy levels of the qubit-resonator system to a plurality of second energy levels by applying an external magnetic flux to vary the excitation frequency of the superconducting LC resonator from a first excitation frequency to a second excitation frequency;
thermalizing the qubit-resonator system to a second temperature such that the second energy levels have second occupation probabilities;
adiabatically shifting the second energy levels of the qubit-resonator system back to the first energy levels by altering the external magnetic flux to vary the excitation frequency of the superconducting LC resonator from the second excitation frequency to the first excitation frequency.

16. The method of claim 15, wherein thermalizing the qubit-resonator system to the first temperature includes thermally coupling the qubit-resonator system to a thermal reservoir having a temperature equal to the first temperature.

17. The method of claim 15, wherein thermalizing the qubit-resonator system to the second temperature includes thermally coupling the qubit-resonator system to a thermal reservoir having a temperature equal to the second temperature.

18. The method of claim 15, wherein at least one of thermalizing the qubit-resonator system to the first temperature and thermalizing the qubit-resonator system to the second temperature includes coupling the qubit-resonator system to a quantum reservoir characterized by a physical temperature parameter and a quantum parameter.

19. The method of claim 18, wherein the quantum reservoir is further characterized by an effective temperature, wherein the effective temperature is based on the physical temperature and the quantum parameter, and wherein the effective temperature is higher than the physical temperature.

20. The method of claim 18, wherein the quantum reservoir comprises one or more of an ensemble of thermal squeezed photons or coherent photons, or a single qubit or qutrit with quantum coherence.

21. The method of claim 18, wherein the quantum reservoir is adapted to thermalize the qubit-resonator system by injecting coherence using the seed coherence control unit and coupling the quantum reservoir to the superconducting flux qubit and the superconducting LC resonator system.

* * * * *